United States Patent
Tomishima

[19]

[11] Patent Number: 6,160,751
[45] Date of Patent: Dec. 12, 2000

[54] SEMICONDUCTOR MEMORY DEVICE ALLOWING EFFICIENT COLUMN SELECTION

[75] Inventor: Shigeki Tomishima, Hyogo, Japan

[73] Assignee: Mitsubishi Denki Kabushiki Kaisha, Tokyo, Japan

[21] Appl. No.: 09/350,921

[22] Filed: Jul. 12, 1999

[30] Foreign Application Priority Data

Jul. 21, 1998 [JP] Japan .................................. 10-205052

[51] Int. Cl.[7] .................................................. G11C 8/00
[52] U.S. Cl. .................................. 365/230.06; 365/230.03
[58] Field of Search ........................ 365/230.06, 230.03, 365/185.11, 185.13

[56] References Cited

U.S. PATENT DOCUMENTS

| 5,487,050 | 1/1996 | Kim et al. .......................... | 365/230.06 |
| 5,715,209 | 2/1998 | Yoo ................................... | 365/230.03 |
| 5,822,268 | 10/1998 | Kirihata ............................. | 365/230.06 |

FOREIGN PATENT DOCUMENTS 6-309875  11/1994  Japan .

OTHER PUBLICATIONS

"A 32–Bank 1 Gb Self–Strobing Synchronous DRAM with 1 Gbyte/s Bandwidth" by Yoo, et al., IEEE Journal of Solid–State Circuits, vol. 31, No. 11, Nov. 1996.

*Primary Examiner*—Tan T. Nguyen
*Attorney, Agent, or Firm*—McDermott, Will & Emery

[57] ABSTRACT

In a memory mat of a semiconductor memory device according to the present invention, a main column select line is provided for every n column addresses and a n sub column select lines are arranged for every main column select line (n is a natural number). In response to a column address signal, a main column select line is selected and a burst circuit and a sub decoder activate a corresponding sub decode signal. A sub column decoder drives a sub column select line according to the states of the main column select line and the sub decode signal.

20 Claims, 13 Drawing Sheets

F I G. 1
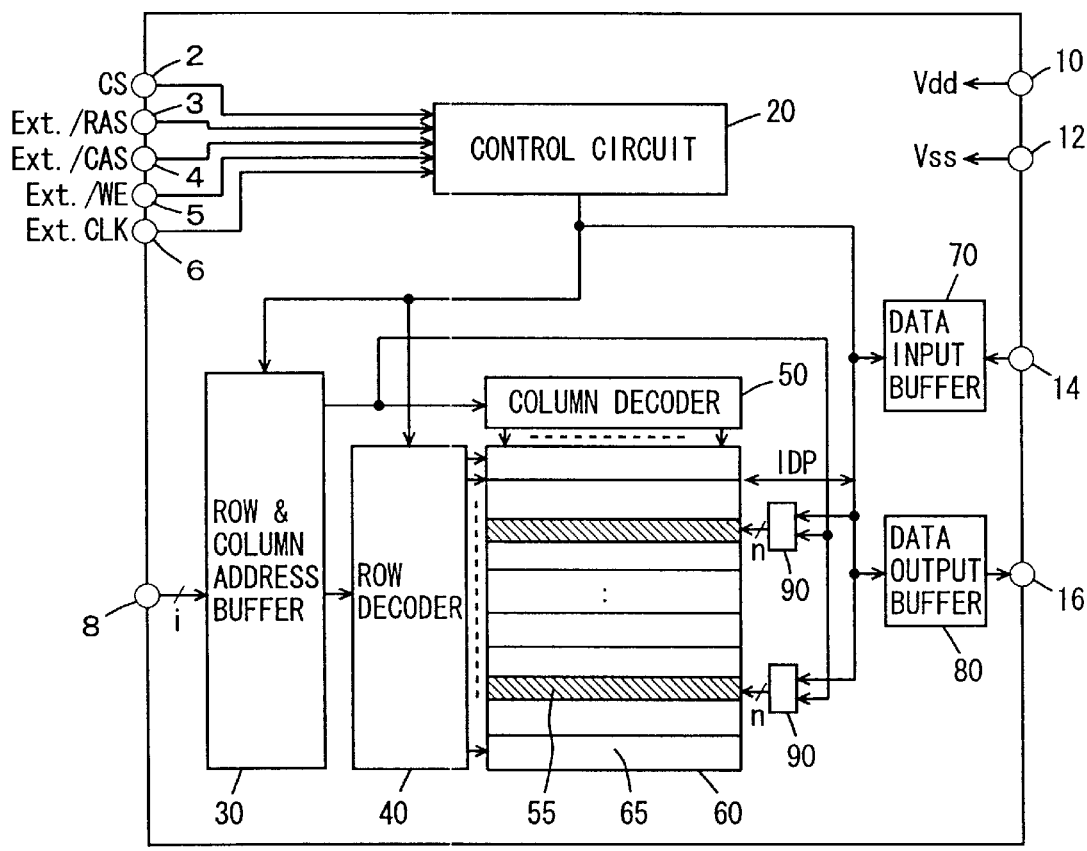

6,160,751

SEMICONDUCTOR MEMORY DEVICE ALLOWING EFFICIENT COLUMN SELECTION

BACKGROUND OF THE INVENTION

1. Field of the Invention

The present invention relates to a semiconductor memory device, and more particularly to a structure of a semiconductor memory device allowing an efficient column selection.

2. Description of the Background Art

With the increase in capacity of semiconductor memory devices in recent years, it has become common that a memory array provided in a semiconductor memory device is divided into blocks of memory cells (hereinafter referred to as a memory mat) and a memory mat is further divided into a plurality of sub blocks.

CONVENTIONAL EXAMPLE 1

FIG. 13 shows an overall structure of a memory cell array of a 64 Mbit DRAM (Dynamic Random Access Memory) 2000 according to a conventional art.

With reference to FIG. 13, DRAM 2000 includes four memory mats 2500 each having 16 Mbit.

FIG. 14 shows a structure of memory mat 2500. With reference to FIG. 14, memory mat 2500 is further divided into sub blocks 2504 by sense amplifier bands 2501 and shunt regions 2502 of word lines. Sub block 2504 includes 32K memory cells, 256 word lines (WL), and 128 sense amplifiers. In other words, 16 Mbit memory mat 2500 is divided into 32 portions by sense amplifier bands 2501 and is divided into 16 portions by shunt regions 2502 of word lines.

In memory mat 2500, a column select line CSL which transmits a column select signal is activated selectively by a column decoder 2530 provided at an end of memory mat 2500. Column select line CSL extends in a column direction and is shared by a plurality of sub blocks as a common signal line shared by memory cells with the same column address in memory mat 2500.

An I/O gate is provided between a local I/O line and a sense amplifier amplifying data held by a memory cell. Data is transmitted between a selected memory cell and the local I/O line through the control of gate potential of a transistor constituting the I/O gate by column select line CSL.

Here, as column select line CSL is formed as a single common signal line in memory mat 2500, in a 64 Mbit DRAM class, a line length thereof exceeds 7 mm, load resistance of the line reaches about 1 KΩ and load capacitance also reaches about 3 pF.

FIG. 15 shows an overall structure of memory mats included in a 256 Mbit DRAM 3000 with a plurality of memory mats. With reference to FIG. 15, the 256 Mbit DRAM includes memory mats 3500 each having 32 Mbits.

Though the design rule of the memory cell has been shrinking according to the miniaturization of transistors, the scale (the number of bits) of each memory mat is increasing up to 32 Mbits.

Though the line length of the column select line in 256 Mbit DRAM 3000 is slightly shorter than that in DRAM 2000, load resistance of the line reaches about 1 KΩ and load capacitance reaches 2 pF.

Thus in a DRAM with large storage capacity, load resistance and load capacitance of the column select line increase according to the increase in line length. Hence, rising and falling speed of the potential on column select line slow. This will cause a significant effect on an operating speed of a semiconductor memory device as a whole when column reading and column writing operations are performed successively, for example. In addition, in a DRAM allowing a simultaneous input/output of data with a large number of bits, a plurality of column select lines must be simultaneously activated. In this case, if the load resistance of the line is high, current consumption will further increase.

CONVENTIONAL EXAMPLE 2

FIG. 16 shows an overall structure of memory mats in a 256 Mbit DRAM 4000, which is an improvement over the structure of the above described 256 Mbit DRAM 3000.

With reference to FIG. 16, 256 Mbit DRAM 4000 includes memory mats 4500 each having 16 Mbits and column decoders 4530 provided between memory mats 4500. In 256 Mbit DRAM 4000, the line length and the line load of the column select line can be reduced to half that of 256 Mbit DRAM 3000 according to Example 1 because column decoder 4530 is arranged between memory mats. Thus, the speed of rise and fall of the potential on column select line is improved, and a faster operation can be expected.

Here, however, as the column address signal must be transmitted from a region of peripherals 4505 to column decoder 4530 by an address signal line, delay is produced corresponding to an extended length of the address signal line. In addition, as the extended address signal line is arranged above memory mats 4500 located between peripherals 4505 and column decoder 4530, data change on the address signal line may adversely affect data stored in the memory cells.

CONVENTIONAL EXAMPLE 3

To prevent the undesirable effect described above accompanying the increase in line length of the column select line, a so-called hierarchical column line scheme has been proposed.

For example, Yoo et al. discloses a structure of a semiconductor memory device adopting the hierarchical column line selection scheme for a DRAM with a multi-bank structure in "A 32-Bank 1 Gb Self-Strobing Synchronous DRAM with 1 GByte/s Bandwidth", IEEE Journal of Solid-State Circuits, VOL. 31, No. 11, November 1996, pp. 1635–1642) (hereinafter referred to as Example 3).

FIG. 17 schematically shows a structure of a memory cell array portion of a multi-bank DRAM 5000 according to Example 3. With reference to FIG. 17, the memory cell array portion includes a memory cell array 5500, a row decoder 5520 and a column decoder 5530. Memory cell array 5500 is divided into eight banks each having sub arrays 5510 arranged in a direction intersecting the column direction. Each sub array includes memory cells for holding data.

Multi-bank DRAM 5000 activates a bank including a memory cell selected according to an address signal and performs the data reading or writing operation of the selected memory cell through row decoder 5520 and column decoder 5530.

FIG. 18 shows a structure of sub array 5510 in detail. In FIG. 18, a shadowed portion of FIG. 17 is shown further in detail.

With reference to FIG. 18, sense amplifiers 5540 are provided at sides of sub array 5510. In sub array 5510, a memory cell selected in response to an address signal is selected by a word line activated by row decoder 5520 and a column select line activated by the column decoder. Here, as in this structure, all the memory cells with the same row address are included in the same bank, one word line is arranged for each row address. As for the column address, however, memory cells with the same column address exist in different banks.

Therefore, a hierarchical structure scheme is adopted for the column selection operation and a main column select line MCSL and a sub column select line SCSL are both provided corresponding to each column address. A sub column decoder 5550 is provided corresponding to each sub array and drives sub column select line SCSL to a select state.

When a word line is driven to the select state, a memory cell connected thereto will be connected to sense amplifier 5540. Then data in the memory cell will be read through a local I/O line 5580 according to the activation of sub column line SCSL. Local I/O line 5580 is connected to a global I/O line 5590 via an I/O select circuit 5600. I/O select circuit 5600 transmits data on local I/O line 5580 in an activated bank to global I/O line 5590.

FIG. 19 is a diagram referenced for describing a structure of sub column decoder 5550. With reference to FIG. 19, main column select line MCSL is a common signal line provided for all banks. A main select line MCSL in a column including a selected memory cell is activated. On the other hand, sub column select line SCSL is a column select line being effective only in one bank.

Sub column select line SCSL is connected to main column select line MCSL via a transistor 5610 having a gate receiving a signal (BS signal) indicating the select state of the bank. In addition, sub column select line SCSL is connected to a ground line via a transistor 5620 having a gate receiving a BBS signal which is an inversion of BS signal.

Sub column decoder 5550 drives sub column select line SCSL to the select state (an "H" level, that is, a logical high level) when main column select line MCSL and BS signal are both activated (to an "H" level).

In other words, in multi-bank DRAM 5000, the line length of sub column select line SCSL directly relating to the memory cell selection can be suppressed with the hierarchical configuration of main column select line MCSL and sub column select line SCSL.

In DRAM 5000 according to Example 3 adopting the hierarchical column select line scheme, however, main column select line MCSL and sub column select line SCSL are arranged for each column address such that one MCSL corresponds to one SCSL. Therefore, the number of signal lines for the column selection doubles. The increase in the number of signal lines shortens the distance between signal lines and further introduces new problems, such as signal delay and short circuit accompanying the increase in line capacitance.

Further, as DRAM 5000 has sub column decoder 5550 with the structure shown in FIG. 19, the potential corresponding to the select state ("H" level) of sub column select line SCSL takes the value of the potential corresponding to the select state ("H" level) of main column select line MCSL minus a threshold voltage of transistor 5610 connected between SCSL and MCSL. In addition, as the bit line through which data of the designated memory cell is read is connected to local I/O line 5580 via a transistor (not shown) connected to the local column select line at its gate, a potential finally received by the local I/O line is lower than the initial potential. Hence, the potential which should correspond to an "H" level of data may be insufficient. If the potential of the active level ("H" level) of BS signal is raised by the amount of a threshold voltage of N-type transistor 5610 to solve this problem, an undesirable increase in power consumption occurs.

SUMMARY OF THE INVENTION

One object of the present invention is to provide a structure of a semiconductor memory device capable of hierarchical column line selection allowing reduction of the number of signal lines relating to column selection, reduction in power consumption and stable operation.

In brief, the present invention is a semiconductor device including a memory mat, a plurality of main column select line, a plurality of sub column select line, a row select circuit, and a column select circuit.

The memory mat includes a plurality of memory cells arranged in a matrix and is divided into a first number of sub block groups along a row direction.

The plurality of main column select lines are shared by the first number of sub block groups and provided for each of a second number of memory cell columns.

The plurality of sub column select lines are provided corresponding to each of the memory cell columns in each of sub block groups.

The row select circuit and the column select circuit select a memory cell in response to an address signal.

The column select circuit includes a main column decode circuit activating at least one of the main column select lines according to the address signal, a sub decode circuit selectively activating at least one of sub decode signals corresponding to the memory cell columns respectively, according to the address signal, sub decode signal lines provided for each of the sub block groups for transmitting the sub decode signals, and a sub column decode circuit activating a corresponding one of the sub column select lines according to potential levels of one of the sub decode signal lines and one of the main column select lines.

According to another aspect of the present invention, a semiconductor memory device includes a memory mat, a plurality of main column select lines, a plurality of sub column select lines, a plurality of data lines, a row select circuit, and a column select circuit.

The memory mat is divided along a row direction to a first number of banks being subjected independently to reading and writing operations. Each of the banks is further divided into a plurality of sub blocks along the row direction.

The plurality of main column select lines are shared by the first number of banks and provided for each of a second number of memory cell columns.

The plurality of sub column select lines are provided corresponding to each of the memory cell columns in each of banks. The plurality of data lines are provided corresponding to the banks, respectively.

The row select circuit and the column select circuit select a memory cell in response to an address signal.

The column select circuit includes a main column decode circuit activating at least one of the main column select lines according to the address signal, a sub decode circuit selectively activating at least one of sub decode signals corresponding to the memory cell columns respectively, according to the address signal, a plurality of sub decode signal lines independently provided for each of the banks for transmitting the sub decode signals, and a sub column decode circuit activating a corresponding one of the sub column select lines according to potential levels of one of the sub decode signal lines and the main column select lines.

According to still another aspect of the present invention, a semiconductor memory device includes a memory mat, a plurality of main column select lines, a plurality of sub column select lines, a plurality of bank select signal line, a row select circuit and a column select circuit.

The memory mat includes a plurality of memory cells arranged in a matrix and is divided into a first number of banks along a row direction subjected independently to reading and writing operations. Each of the banks is further divided into a plurality of sub blocks along the row direction.

The plurality of main column select lines are shared by the first number of banks and provided corresponding to each of memory cell columns.

The plurality of sub column select lines are provided for each of memory cell columns in each of the banks.

The plurality of bank select signal line is arranged for each of banks.

The row select circuit and the column select circuit select a memory cell in response to an address signal.

The row select circuit activates one of the bank select signal lines corresponding to a bank including the selected memory cell.

The column select circuit includes a main column decode circuit activating at least one of the main column select lines according to the address signal, and a plurality of sub column decode circuits provided for said sub column select signal lines respectively, for selectively activating the sub column select lines according to potential levels of one of the bank select signal lines and the main column select lines. The sub column decode circuit includes a first transistor provided to allow an electrical connection of one of the main column select lines and corresponding one of the sub column select lines, a second transistor provided to allow an electrical connection of one of the bank select signal lines and a gate of the first transistor, having a gate connected to a first power supply lines having a potential level corresponding to an active state of the sub column select line, and a third transistor provided to allow an electrical connection of the corresponding one of sub column select lines and a second power supply line having a potential level corresponding to an inactive state of the sub column select line, having a gate receiving a potential corresponding to an inverted logical level of a signal on the one of main column select lines.

Therefore the main advantage of the present invention is that the fast column selection operation with low power consumption can be achieved by the column selection by the combination of the main column select line commonly provided for all sub block groups and the sub decode signal line provided for each of sub block groups.

Another advantage of the present invention is that the same effect can be obtained also in the multi-bank structure where a memory mat is divided into a plurality of banks each operate independently.

Still another advantage of the present invention is that, in the column selection operation by the main column select line and the sub column select line configured in a hierarchical manner, stable operation can be achieved by maintaining the potential corresponding to the active state of the sub column select line at a sufficient level.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows an overall structure of a semiconductor memory device 1000 according to first embodiment of the present invention.

DESCRIPTION OF THE PREFERRED EMBODIMENTS

First Embodiment

Figure 2:
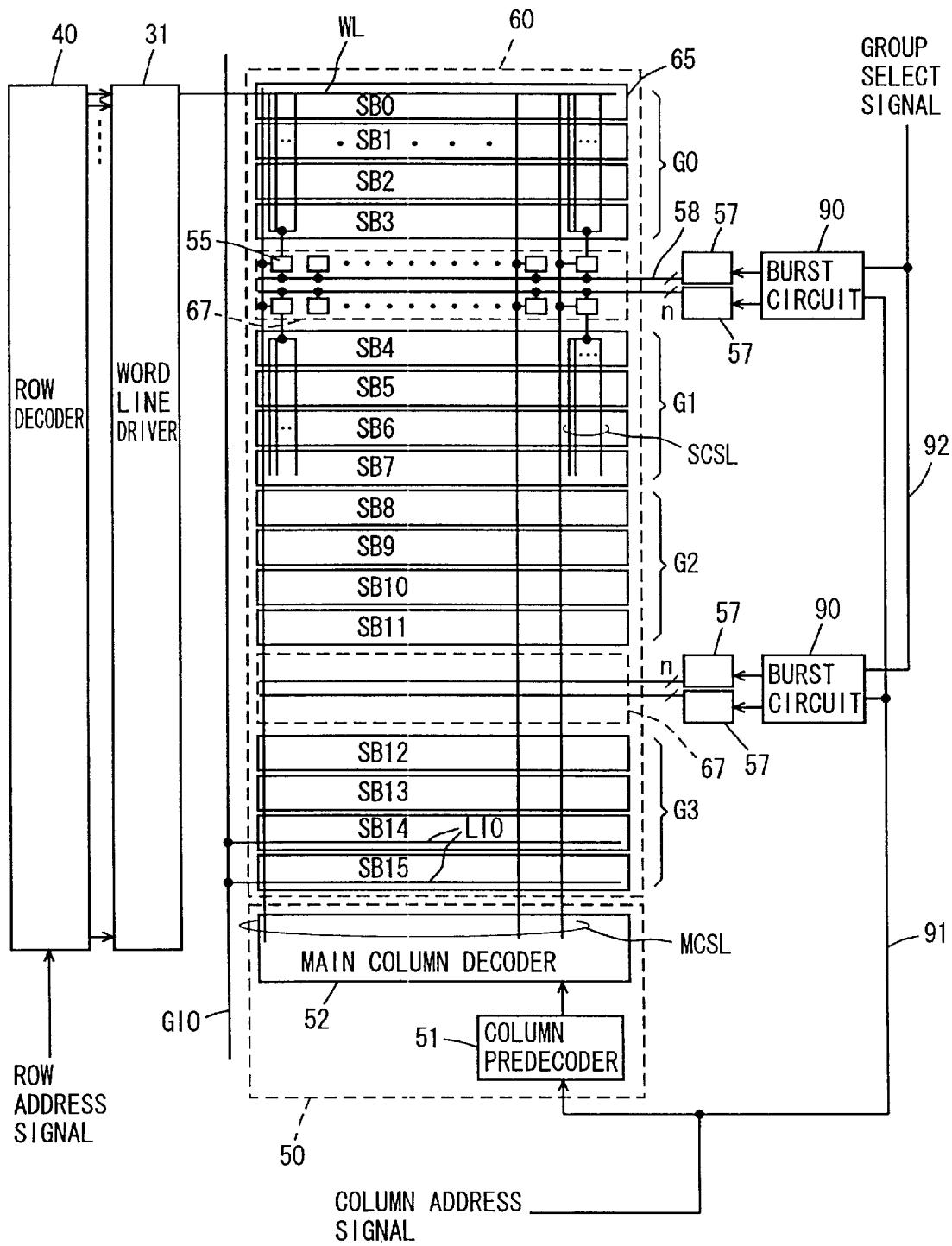
FIG. 2 is a schematic diagram for showing a structure of a memory mat 60 and peripherals of semiconductor memory device 1000.

FIG. 1 is a diagram showing an overall structure of a semiconductor memory device 1000 according to first embodiment of the present invention.

With reference to FIG. 1, semiconductor memory device 1000 includes control signal input terminals 2–6, an address signal input terminal 8, an input terminal 14 for receiving a data signal, an output terminal 16 for supplying a data signal, a power supply terminal 10 and a ground terminal 12.

Semiconductor memory device 1000 further includes a control circuit 20, a row and column address buffer 30, a row decoder 40, a column decoder 50, a sub column decoder 55, a burst circuit 90 and a memory mat 60.

Control circuit 20 generates a control clock corresponding to a predetermined operation mode in synchronization with a row address strobe signal Ext./RAS, a column address strobe signal Ext./CAS, a chip select signal CS, a write enable signal Ext./WE, and an external clock signal Ext. CLK supplied from an external source via control terminals 2–6 and controls an operation of semiconductor memory device 1000 as a whole.

Here, as is obvious from the description below, the structure of the invention of the present application is not limited to the structure of a so-called synchronous semiconductor memory device.

Row and column address buffer 30 supplies to row decoder 40, column decoder 50, sub column decoder 55 and burst circuit 90 an address signal generated based on address signals A0–Ai (i is a natural number) supplied from an external source. Memory mat 60 is divided into a plurality of sub blocks 65. Each sub block includes memory cells holding data.

Based on the address signal, row decoder 40 performs row selection and column decoder 50 and sub column decoder 55 perform column selection. A selected memory cell in memory mat 60 transmits/receives data to/from an external device via an I/O line (not shown) through a data input buffer 70 and input terminal 14 or a data output buffer 80 and output terminal 16.

FIG. 2 schematically shows a structure of memory mat 60 and its peripherals of semiconductor memory device 1000. In FIG. 2, memory mat 60 is divided into 16 portions (SB0–SB15) along the row direction, as an example. Therefore, a memory cell with the same column address is included in each of SB0–SB15.

A global I/O line GIO extends in the column direction so as to cover all sub blocks SB0–SB15. Global I/O line GIO is connected to a local I/O line arranged for each sub block via a transmission gate (not shown). A sub block including a memory cell selected (hereinafter referred to as a selected memory cell) in response to the address signal is activated and then data is transmitted via local I/O line LIO in the activated sub block to global I/O line GIO through the selection of transmission gate.

In addition, row decoder 40, a word line driver 31 and a word line WL are arranged to render a row corresponding to a row address signal a select state. Row decoder 40 decodes a supplied row address signal and supplies a row select signal (word line select signal) designating a selected row address. Word line driver 31 renders a corresponding word line WL a select state according to the word line select signal.

On the other hand, a column predecoder 51, a main column decoder 52, a sub column decoder 55, a sub decoder 57 and burst circuit 90 are arranged to render a corresponding column a select state according to a column address signal.

Above mentioned sub blocks SB0–SB15 are divided into four groups (G0–G3) and sub column decoder 55 directly driving sub column select line SCSL is arranged in a sub column decoder band 67 provided for each group. Sub column decoder band 67 is provided between sub blocks belonging to different groups to achieve an efficient layout, and in FIG. 2, it is provided between SB3 and SB4, and between SB11 and SB 12 as an example.

Though the column selection operation is performed by the column select line adopting the hierarchical structure scheme, unlike Example 3, main column select line MCSL is provided for every n column addresses. Corresponding to one main column select line MCSL, n sub column select lines are provided (n is a natural number). Sub column select line SCSL is provided for every column and independently for each group as a common signal line for sub blocks belonging to the same group.

Column predecoder 51 and main column decoder 52 select a main column select line MCSL designated corresponding to an upper bit of the supplied column address signal. On the other hand, sub column select line SCSL is driven to a select state by sub column decoder 55 according to the activation of a sub decode signal line 58 and main column select line MCSL driven to a select state by burst circuit 90 and sub decoder 57 according to a lower bit of the column address signal. Burst circuit 90 and sub decoder 57 are provided in the vicinity of and next to sub column decoder band 67. The process of sub column select line SCSL selection will be described hereinafter in detail.

Local I/O line LIO is provided for each sub block. Selected memory cell is designated by the above mentioned word line WL and sub column select line SCSL and is connected to local I/O line LIO. Global I/O lines GIO are each arranged to allow the transmission of data with all sub blocks SB0–SB15. Thus, data is transmitted between a memory cell selected according to the address signal and global I/O line GIO.

Figure 3:
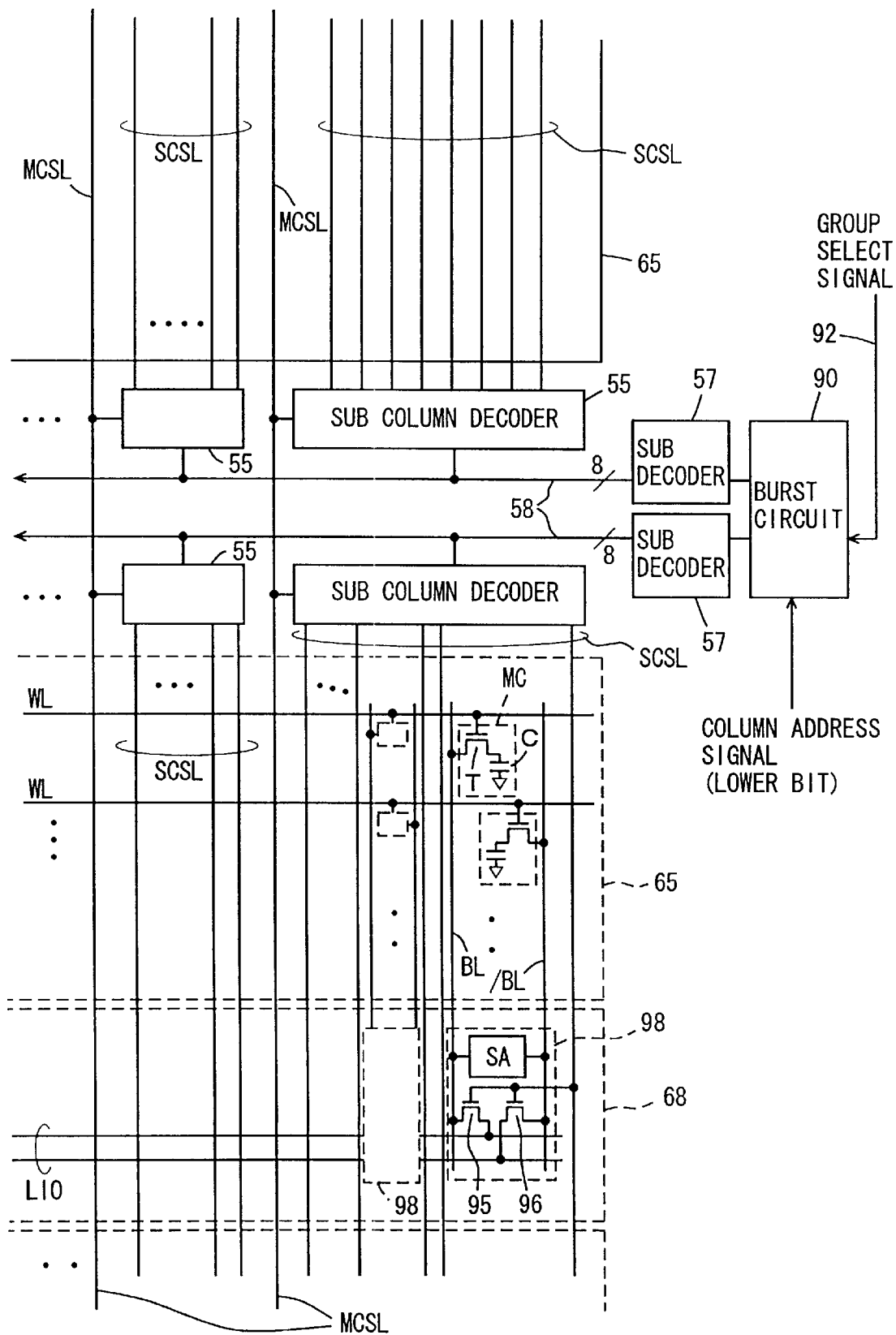
FIG. 3 is a diagram referenced for describing an operation of a sub column decoder 55 in semiconductor memory device 1000.

FIG. 3 is shown to describe an operation of sub column decoder 55, in other words, the process of sub column select line SCSL selection in semiconductor memory device 1000. In semiconductor memory device 1000, a main column select line MCSL is provided for every eight column addresses, as an example.

With reference to FIG. 3, a lower bit of a column address signal relating to the above mentioned burst operation is supplied to burst circuit 90.

Burst circuit 90 latches the address signal represented by the lower bit mentioned above and generates a burst address by a successive count up based on the latched address.

In addition, burst circuit 90 receives a group select signal transmitted through a group signal transmission line 92 for activating a group to which a sub block including a selected memory cell belongs, activates a corresponding sub decoder 57, and transmits the burst address.

Sub decoder 57 activated by burst circuit 90 generates a sub decode signal according to the burst address. The sub decode signal is transmitted to sub column decoder 55 via sub decode signal line 58. Sub decode signal line 58 extends in sub column decoder band 67 in the row direction intersecting with main column select line MCSL.

Sub decoder 57 is provided corresponding to each of groups G0–G3. Only a sub decoder 57 corresponding to a group to which a sub block including a selected memory cell belongs is activated. When sub block SB4 is selected, for example, burst circuit 90 may perform latching and counting operations corresponding to G1 and transmit the burst address to sub decoder 57 which generates a sub decode signal. Then, a sub decode signal line 58 corresponding to a group including the selected sub block is activated. On the other hand, sub decoder 57 and sub column decoder 55 corresponding to G0 remain inactivated, whereby unnecessary power consumption can be prevented.

Next, the relation between the latching and counting operations by burst circuit 90 and the generation of sub decode signal will be described.

Figure 4:
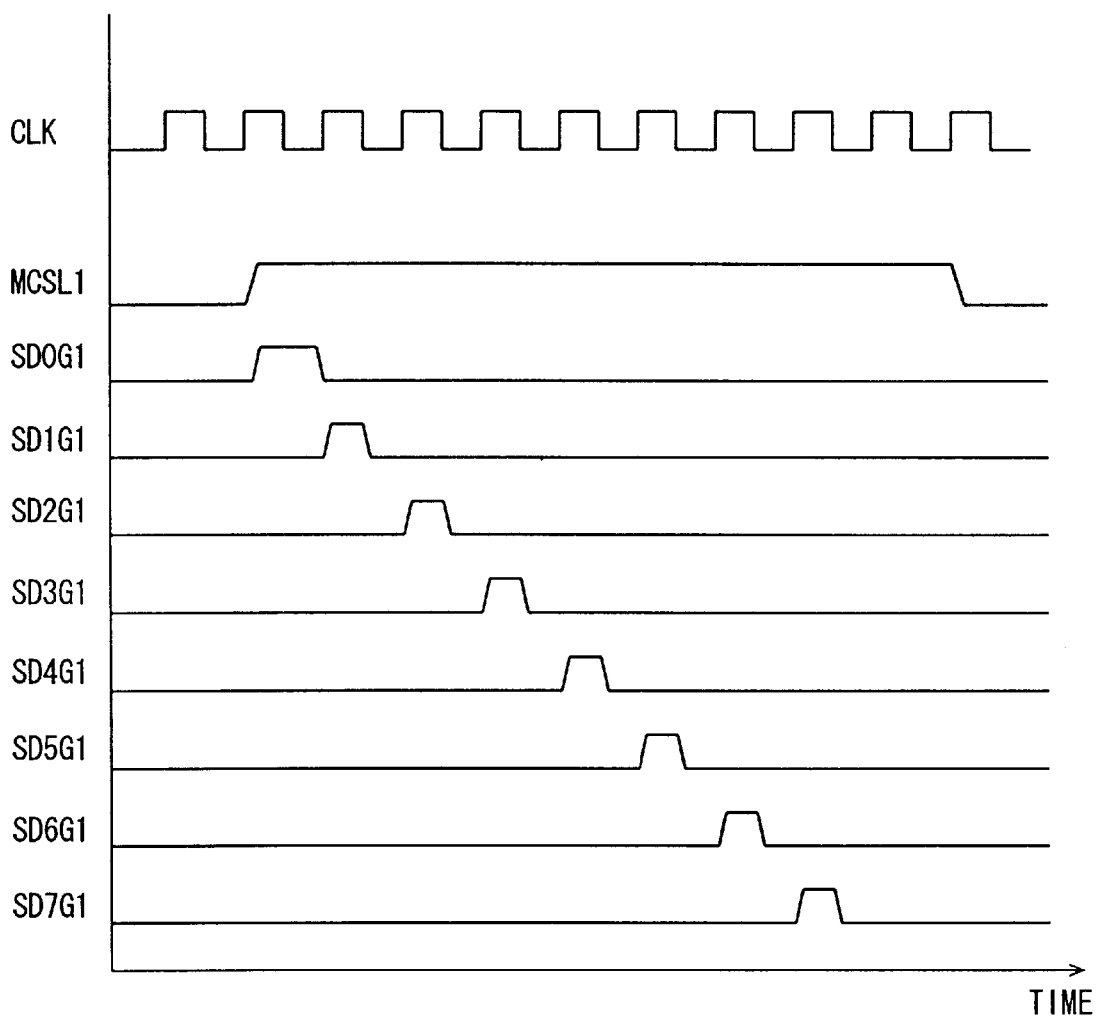
FIG. 4 is a timing chart referenced for describing an operation of a sub decoder 57 in semiconductor memory device 1000.

FIG. 4 is a timing chart shown for describing an operation of sub decoder 57. In FIG. 4, an operation at the selection of a sub block belonging to group G1 is described as an example, provided that the burst length at reading and writing operation is 8. First, a main column select line MCSL1 is driven to a select state according to an upper bit of a column address signal. On the other hand, an address relating to the burst operation designated by a lower bit of the column address signal is decoded and latched by burst circuit 90. Thereafter, a sub decode signal SD0G1 alone in group G1 is driven to a select state.

According to the activation of main column select line MCSL1 and sub decode signal SD0G1, a corresponding sub column select line SCSL is activated. Then, burst circuit 90 counts up the burst address and sub decode signals SD0G1–SD7G1 are sequentially risen for one clock of CLK signal corresponding to the burst length, that is 8. The pulse width of each sub decode signal corresponds to one cycle of the clock signal. Here, as the active state of main column select line MCSL1 is maintained until the burst operation completes, sub column decoder 55 sequentially activates corresponding sub column select lines SCSL according to the change in sub decode signals SD0G1–SD7G1.

Thus, by the hierarchical structure of column select lines and the burst operation, a plurality of columns can be selected by every selection of main column select line MCSL, whereby efficiency of memory cell access is improved.

Though in semiconductor memory device 1000, the burst length is set equal to the number of sub column select lines SCSL controlled by each sub column decoder 55 (hereinafter referred to as SCSL number/sub column decoder), it can take a different value. To achieve a smooth burst operation, however, SCSL number/sub column decoder must be larger than set burst length. In addition, for the effective utilization of sub column select line SCSL, SCSL number/sub column decoder is desirably designed to take the same value as the possible maximum value of burst length (maximum burst length).

Again with reference to FIG. 3, sub block 65 includes a plurality of memory cells MCs arranged in a matrix with rows and columns. Memory cell MC includes a capacitor C and an active transistor T. A bit line pair BL,/BL extends in a sub block corresponding to a column address. In addition, a word line WL extends in the row direction corresponding to a row address. Memory cell MC is arranged at a crossing of word line WL and bit line pair BL,/BL.

A sense I/O circuit 98 is provided in a sense I/O circuit band 68 provided next to sub block 65, corresponding to bit-line pair BL,/BL arranged corresponding to each column of sub block 65. Sense I/O circuit 98 includes a sense amplifier SA differentially amplifying the potential on corresponding bit line pair BL,/BL and transmission gates 95 and 96 responsive to a column select signal supplied through sub column select line SCSL for connecting corresponding bit line pair BL,/BL (a sense node of sense amplifier SA) and a corresponding local I/O line LIO.

In sense I/O circuit band 68, local I/O line LIO is provided for each sub block. According to the activation of sub block, data is transmitted between local I/O line LIO and global I/O line GIO.

Figure 5:
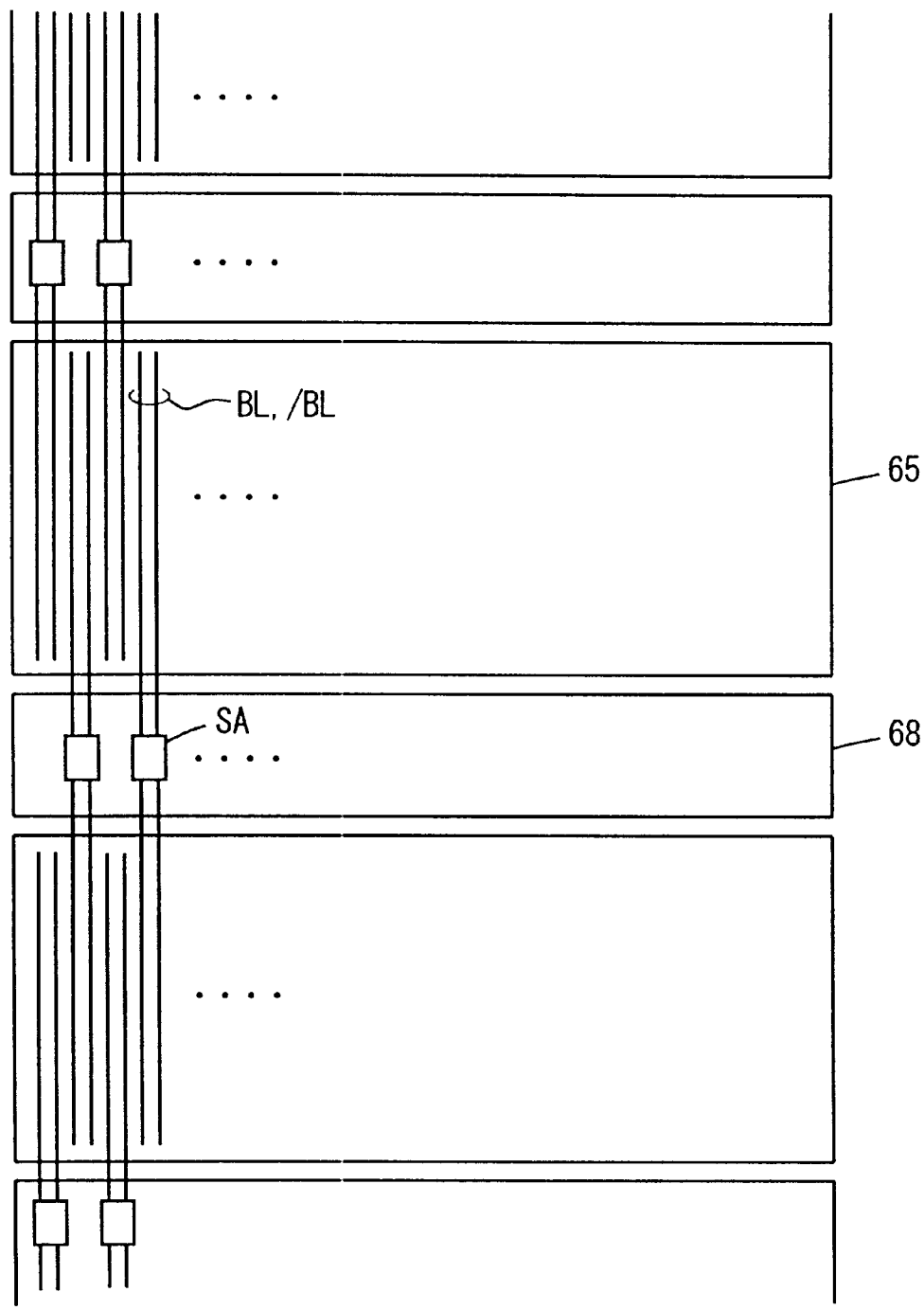
FIG. 5 shows a manner of connection between a sense amplifier and a bit line in semiconductor memory device 1000.

FIG. 5 shows a manner of connection between sense amplifier SA and bit line pair BL,/BL in each sub block. With reference to FIG. 5, sense I/O circuit band 68 is provided between sub blocks 65. Each sense amplifier SA is connected to a memory cell included in one of adjacent sub blocks 65 via bit line pair BL,/BL.

Sense I/O circuit band 68 is activated according to the selection of sub block 65. Sense I/O circuit band 68 is arranged in a so-called shared sense amplifier arrangement where a sense amplifier provided in the same region is shared by adjacent sub blocks, whereby area can be reduced and an efficient layout design is allowed. The arrangement of sense amplifier of the present invention, however, is not limited to the above mentioned shared sense amplifier arrangement.

In semiconductor memory device 1000 with the above described structure, sub column select line SCSL is independently provided for each group, thereby the length of the column select line can be suppressed. As the capacitance and load of the column select line can be thus suppressed, rising and falling times of the signal are shortened and fast column selection operation and reduction in power consumption are allowed.

In addition, dissimilar to DRAM 5000 according to the hierarchical column selection scheme of Example 3, where main column select line MCSL and sub column select line SCSL correspond one by one, in semiconductor memory device 1000 with the structure according to the present invention, eight sub column select lines SCSL correspond to one main column select line MCSL. Therefore the number of signal lines can greatly be reduced.

Thus even when the main column select line and the sub column select line are arranged in the same layer, the undesirable effect accompanying the reduction in distance between signal lines introduced in Example 3 can be eliminated.

In addition, even when the main column select line and the sub column select line are arranged in different interconnection layers, distance between main column select lines can be made much wider than that in Example 3, whereby line capacitance can be reduced. Therefore fast column selection operation and reduction in power consumption are expected to be achieved.

Specific Structure of Sub Column Decoder

As can be seen from the foregoing, sub column decoder 55 drives sub column select line SCSL to a select state according to a select state of main column select line MCSL and a select state of sub decode signal line 58.

Figure 6:
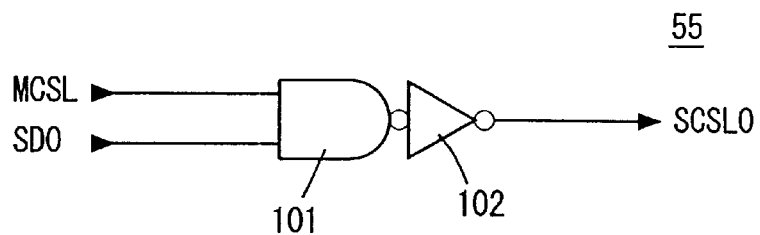
FIG. 6 is a circuit diagram showing an example of a structure of a sub column decoder 55.

FIG. 6 is a diagram showing an example of a structure of sub column decoder 55.

FIG. 6 shows a structure of the sub column decoder corresponding to sub decode signal SD0. With reference to FIG. 6, sub column decoder 55 includes an NAND gate 101 receiving a signal from main column select line MCSL and sub decode signal SD0 as two inputs and an inverter 102 receiving and inverting an output of NAND gate 101 and supplying the resulting signal as an output. Sub column select line SCSL0 is activated (turned to an "H" level) by NAND gate 101 and inverter 102 when both MCSL and SD0 are at an active state ("H" level).

Figure 7:
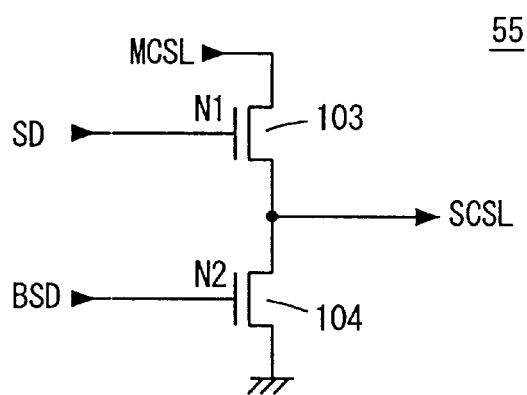
FIG. 7 is a circuit diagram showing a structure of sub column decoder 55 allowing an advantageous layout.

FIG. 7 is a diagram showing an example of the structure of sub column decoder 55 advantageous for layout.

In FIG. 7, sub decode signal SD is supplied as complementary signals, and, a sub decode signal SD and its inversion, signal BSD are supplied to sub column decoder 55. With reference to FIG. 7, sub column decoder 55 includes an N type transistor 103 receiving sub decode signal SD at its gate and connecting main column select line MCSL and sub column select line SCSL, and an N type transistor 104 receiving signal BSD at its gate and connecting sub column select line SCSL and a ground line.

In a circuit shown in FIG. 7, when sub decode signal SD is at an in active state ("L" level), signal BSD attains an "H" level and sub column select line SCSL is rendered an inactive state ("L" level) by the conduction of N type transistor 104.

Conversely, at the activation of sub decode signal SD, N type transistor 104 turns off and N-type transistor 103 turns on. Then, main column select line MCSL and sub column select line SCSL are connected, and with the activation of MCSL, sub column select line SCSL is activated (to an "H" level).

As sub column decoder 55 with the structure shown in FIG. 7 consists only of N-type transistors, layout area can be reduced. The potential corresponding to the select state of sub column select line SCSL, however, remains the value of the potential corresponding to an active state ("H" level) of main column select line MCSL minus the threshold voltage of N-type transistor 103. Therefore the disadvantage mentioned with regard to Example 3 can not be eliminated.

Figure 8:
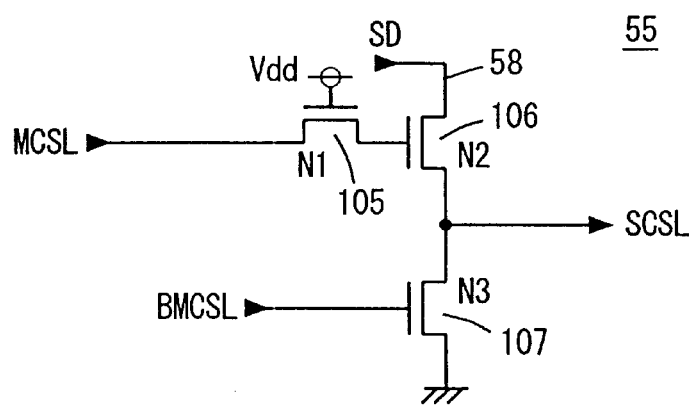
FIG. 8 is a circuit diagram showing a structure of sub column decoder 55 capable of obtaining a potential level of a sub column select line SCSL at a select state ("H" level).

FIG. 8 is a circuit diagram showing a structure of sub column decoder 55 for obtaining a sub column select line SCSL attaining a sufficient potential level at a select state ("H" level).

In FIG. 8, a signal on main column select line MCSL and an inverted signal thereof on BMCSL are supplied to sub column decoder 55.

With reference to FIG. 8, sub column decoder 55 includes an N-type transistor 105 having a drain connected to main column select line MCSL and a gate coupled to a power supply line, an N-type transistor 106 having a gate connected to main column select line MCSL via N-type transistor 105 and connecting sub decode signal line 58 and sub column select line SCSL, and an N-type transistor 107 having a gate receiving the signal on BMCSL and connecting sub column select line SCSL and the ground line.

With reference to FIG. 8, N-type transistor 105 is rendered conductive by the power supply line. Here, when main column select line MCSL is rendered an active state ("H" level), the gate potential of N-type transistor 106 attains an "H" level and N-type transistor 106 is rendered conductive, and then electric charge is stored in gate-to-source parasitic capacitance of N-type transistor 106.

If sub decode signal SD turns to an active state ("H" level) in this condition, the potential of sub column select line SCSL attains a level corresponding to an "H" level by the conduction of N-type transistor 106.

Here, the sum of the potential on sub column select line SCSL and the potential stored in gate-to-source parasitic capacitance of N-type transistor 106 is applied to the gate of N-type transistor 106. Therefore, the problem of the drop of the potential which should correspond to the "H" level of sub column select line SCSL which occurs in sub column decoder 55 with the structure of Example 3 and FIG. 7 is eliminated.

In addition, though in first embodiment, burst circuit 90 is shared by two groups (G0, G1 and G2, G3) and sub decode signal is generated by sub decoder 57 corresponding to each group, for reduction of the number of circuit elements and layout area saving, bust circuit 90 can be provided one for each group.

Modification of First Embodiment

Figure 9:
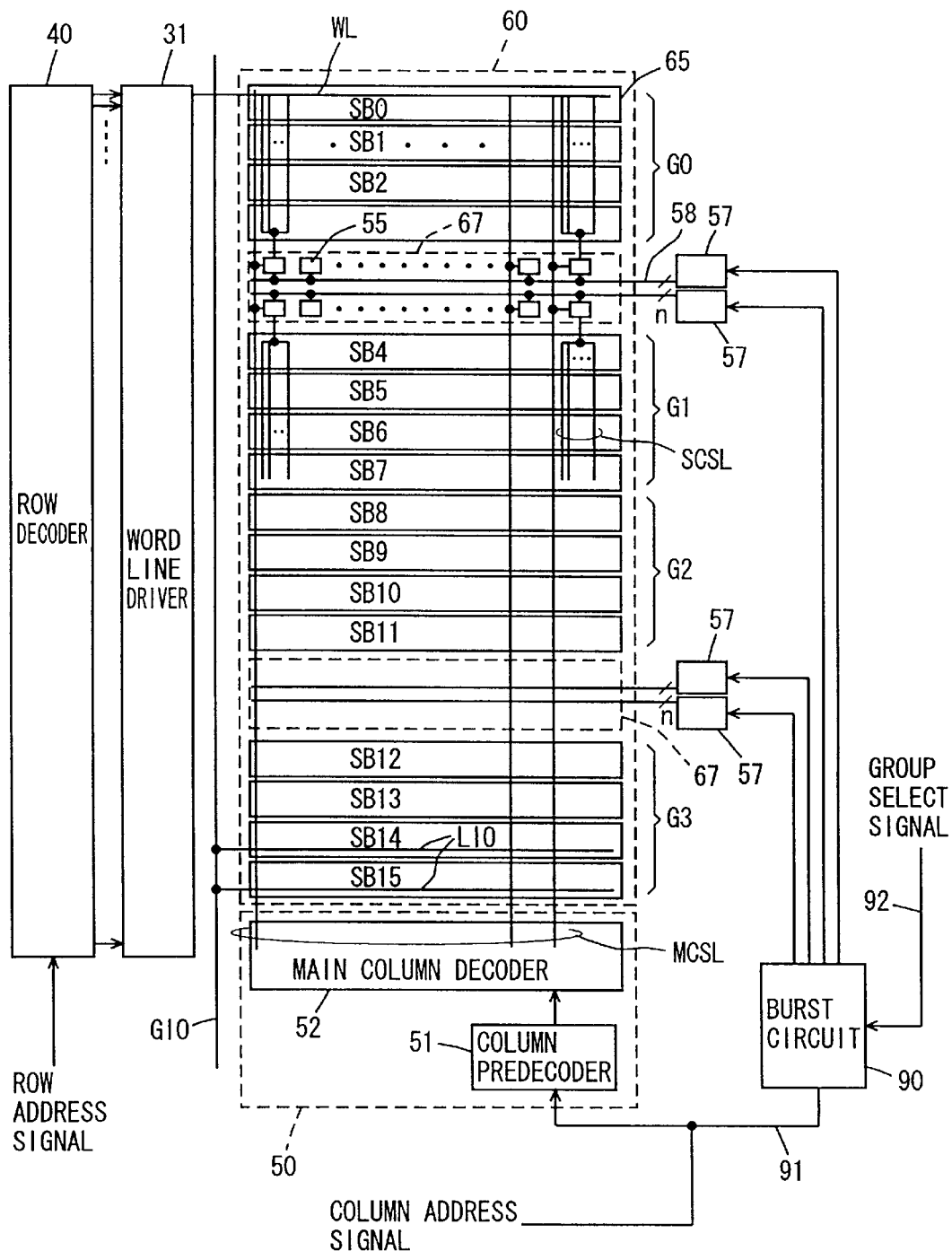
FIG. 9 shows a structure of memory mat 60 and its peripherals in semiconductor memory device 1100 which is a modification of first embodiment of the present invention.

FIG. 9 is a schematic diagram showing a structure of memory mat 60 and peripherals of a semiconductor memory device 1100 according to the modification of first embodiment of the present invention.

Semiconductor memory device 1100 is characterized by the centralized arrangement of burst circuit 90 as a shared circuit for all groups.

Dissimilar to the device shown in FIG. 2, semiconductor memory device 1100 shown in FIG. 9 includes a single burst circuit 90 as a shared circuit for all groups. Burst circuit 90 is connected to an address signal line 91 and a group select signal line 92. Burst circuit 90 receives a lower bit signal of column address signal relating to the selection of sub column select line SCSL via address signal line 91, latches the address signal represented by the lower bit and generates a burst address by performing a successive count-up. Burst circuit 90 activates a sub decoder 57 corresponding to a group to which a selected sub block belongs according to a signal on group select signal line 92 and supplies the burst address.

The activated sub decoder 57 activates sub decode signal line 58 based on the burst address. Sub column select line SCSL is driven to a select state by sub column decoder 55 according to the activation of sub decode signal line 58 and main column select line MCSL. The structure and operation are the same with that of semiconductor memory device 1000 shown in FIG. 2 in other aspects and the description thereof will not be repeated.

As the number of burst circuits 90 can be reduced in semiconductor memory device 1100, semiconductor memory device 1100 has advantages of the elements reduction and layout efficiency improvement besides the advantages in semiconductor memory device 1000. In semiconductor memory device 1100, however, dissimilar to semiconductor memory device 1000, transmission of the burst address to sub decoder 57 arranged for each group is necessary. Hence, the number of signal lines increases and transmission delay of the burst address is generated.

In other words, with the decentralized arrangement of burst circuit 90 as in semiconductor memory device 1000, the time for transmission of the burst address and hence the time required for burst operation can be reduced.

Second Embodiment

Figure 10:
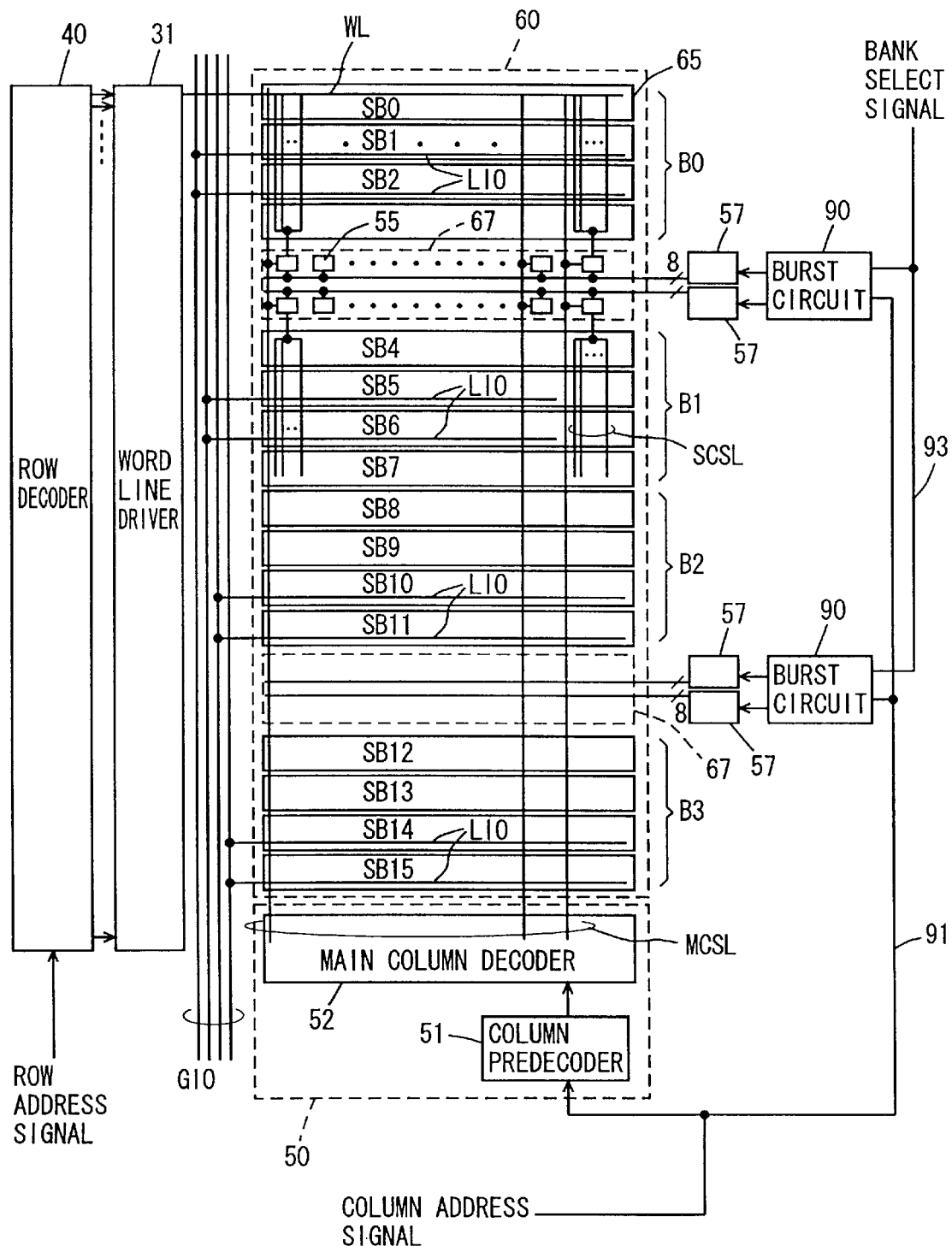
FIG. 10 shows a structure of a semiconductor memory device 1200 having a multi-bank structure according to second embodiment of the present invention.

FIG. 10 is a schematic diagram showing a structure of memory mat 60 and peripherals of a semiconductor memory device 1200 according to second embodiment of the present invention. In semiconductor memory device 1200, one main column select line MCSL is arranged for every eight column addresses, as an example, as in first embodiment.

With reference to FIG. 10, in semiconductor memory device 1200, memory mat 60 is divided into 16 sub blocks 65 (SB0–SB15) and four sub blocks constitute one bank. In other words, memory mat 60 is divided into four banks B0–B3 each including four sub blocks.

For each of banks B0–B3, global I/O line GIO is arranged in the column direction so as to allow the transmission of data with local I/O lines LIO of sub blocks belonging to the bank. Global I/O line GIO is connected to local I/O line LIO via a transmission gate (not shown) arranged for each sub block.

The activation is selected separately for each- bank and data is transmitted between the selected memory cell and local I/O line LIO. On the other hand, data is transmitted between local I/O line LIO and global I/O line GIO according to the selection of transmission gate. Therefore data can be written/read independently at each bank.

Semiconductor memory device 1200 has the structure of hierarchical column select lines corresponding to the multi-bank structure.

Similar to the device shown in FIG. 2, sub decoder 57 and sub decode signal line 58 are provided for each bank. In addition, burst circuit 90 is arranged so as to be shared by two banks. Sub column decoder 55 is provided corresponding to each main column select line MCSL in sub column decoder band 67 provided between bank B0 and bank B1, and between bank B2 and bank B3.

For the selection of each bank, the activation thereof is designated by a bank select signal line 93. Burst circuit 90 receives a signal from bank select signal line 93, activates sub decoder 57 corresponding to a bank designated to be activated, and generates the sub decode signal. Similar to the device shown in FIG. 2, the sub decode signal is generated only in the bank designated to be activated.

Figure 11:
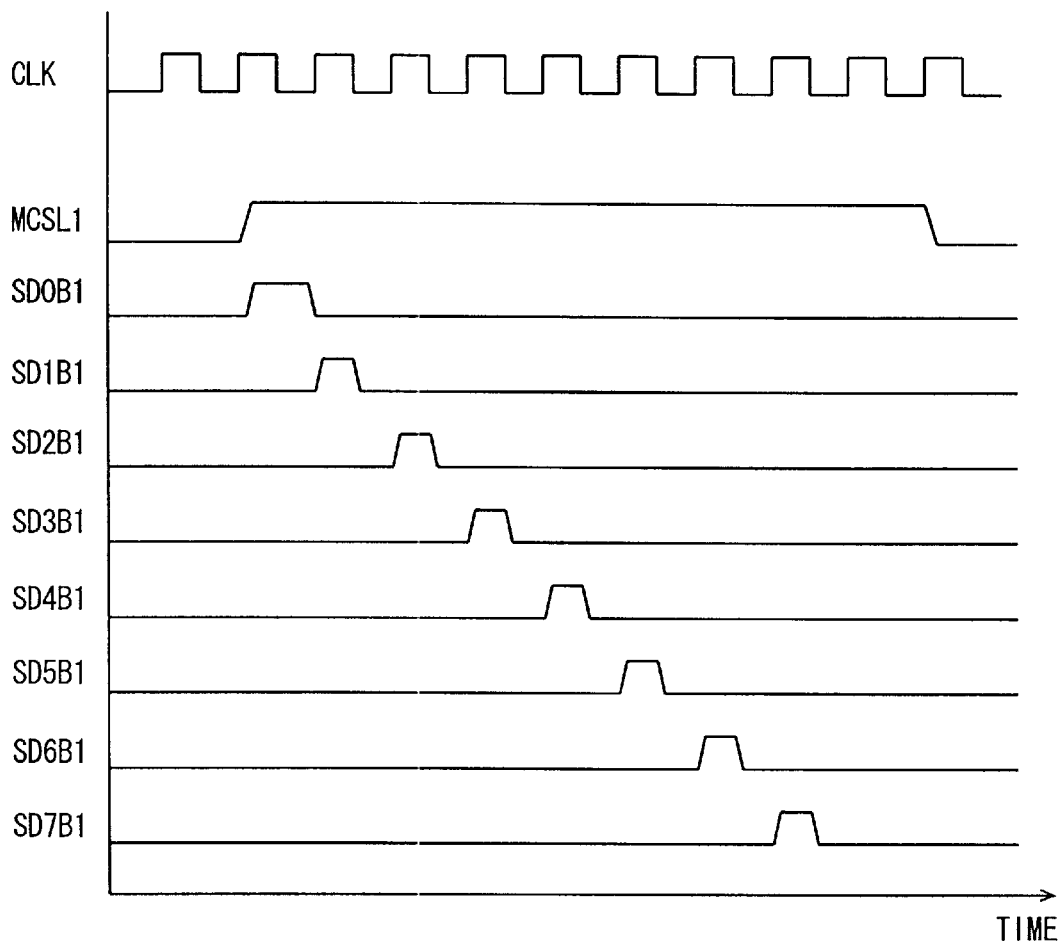
FIG. 11 is a timing chart referenced for describing an operation of sub decoder 57 in semiconductor memory device 1200.

FIG. 11 is a timing chart referenced for describing an operation of sub column decoder 55 in semiconductor memory device 1200.

In FIG. 11, an operation at the selection of a sub block belonging to bank B1 is described as an example, assuming that the burst length of reading and writing operation is eight. First, a main column select line MCSL1 is driven to a select state by an upper bit of the column address signal. On the other hand, an address designated by a lower bit of the column address signal relating to the burst operation is decoded by burst circuit 90 and latched. Then, sub decode signal SD0B1 of bank B1 alone will be driven to a select state.

With the activation of main column select line MCSL1 and sub decode signal SD0B1, a corresponding sub column select line SCSL is activated. Then, the burst address is count up by burst circuit 90 and sub decode signals SD1B1–SD7B1 are sequentially risen for one clock of the CLK signal corresponding to the burst length 8. The pulse width of each sub decode signal corresponds to one cycle of the clock signal. Here, as main column select line MCSL1 maintains an active state until the burst operation completes, corresponding sub column select lines SCSL are sequentially activated according to the change in sub decode signals SD0B1–SD7B1.

The specific circuit structure of sub column decoder 55 and SCSL number/sub column decoder can be considered to be the same with that of semiconductor memory device 1000.

With the above described structure, the advantages obtained in semiconductor memory device 1000 performing hierarchical column selection can be obtained also in semiconductor memory device 1200 with multi-bank structure.

Third Embodiment

An object of third embodiment is to prevent the generation of an insufficient "H" level potential on sub column select line SCSL in multi-bank DRAM 5000 according to Example 3.

Figure 18:
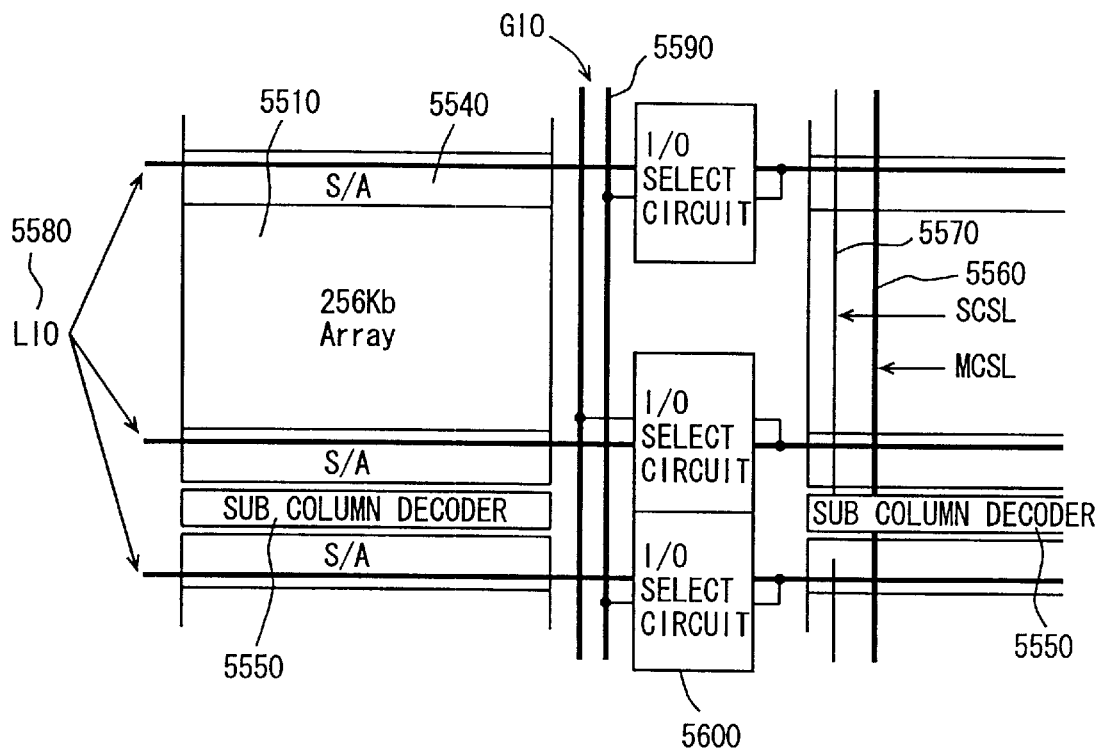
FIG. 18 is a circuit diagram showing a structure around a sub array 5510 of multi-bank DRAM 5000 according to a conventional art.
Figure 19:
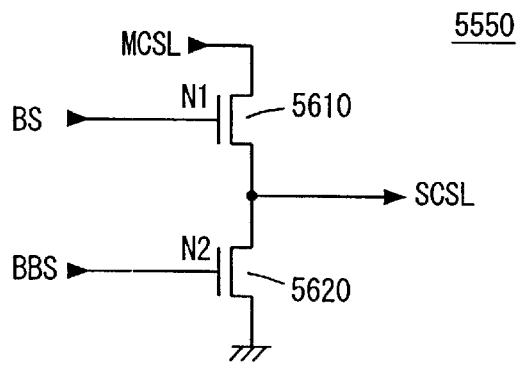
FIG. 19 is a circuit diagram showing a structure of a sub column decoder 5550 of multi-bank DRAM 5000 according to a conventional art.

In multi-bank DRAM 5000, the above mentioned problem occurs because sub column decoder 5550 has the structure shown in FIG. 19. Therefore, in third embodiment of the present invention, the sub column decoder shown in FIG. 18 is changed to have the circuit structure shown in FIG. 12.

Figure 12:
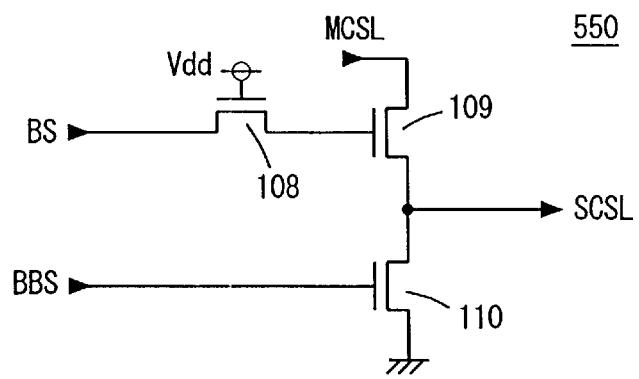
FIG. 12 shows a circuit structure of sub column decoder 550 according to third embodiment.
Figure 13:
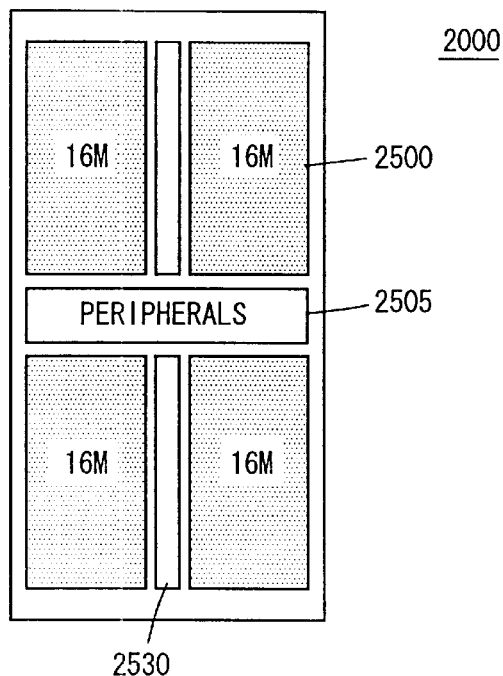
FIG. 13 shows an overall structure of a semiconductor memory device 2000 according to a conventional art.
Figure 14:
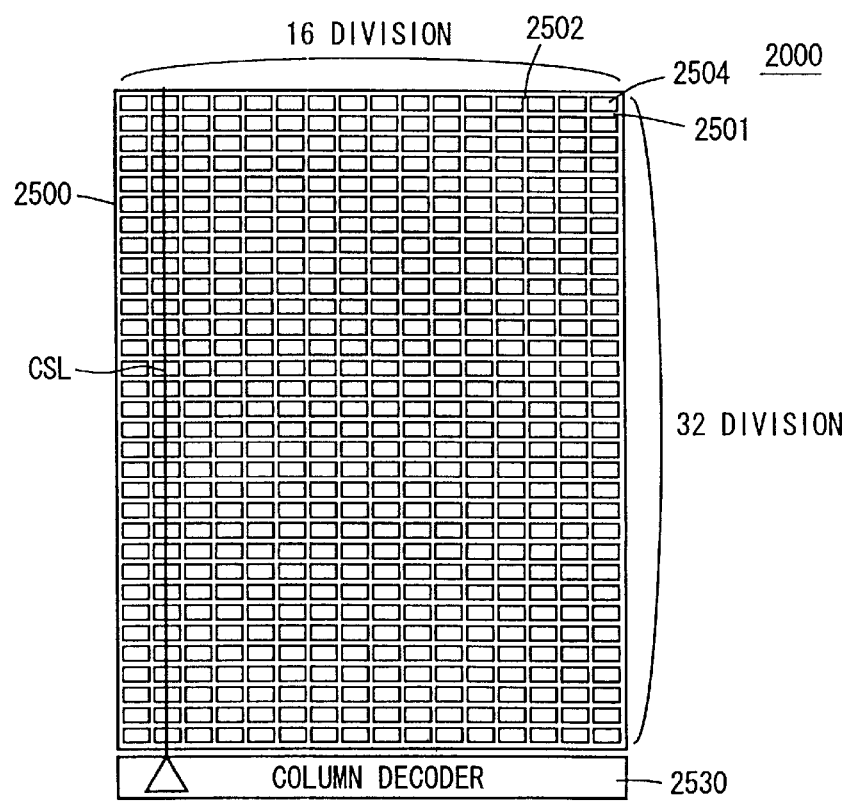
FIG. 14 is a diagram for showing in detail a structure of a memory mat included in semiconductor memory device 2000 according to a conventional art.
Figure 15:
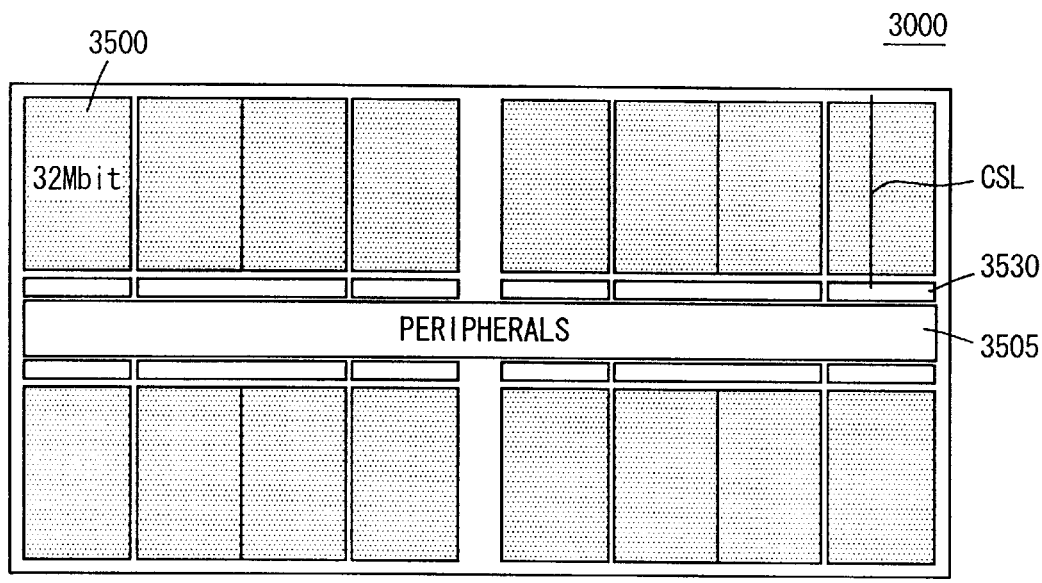
FIG. 15 shows an overall structure of a semiconductor memory device 3000 according to a conventional art.
Figure 16:
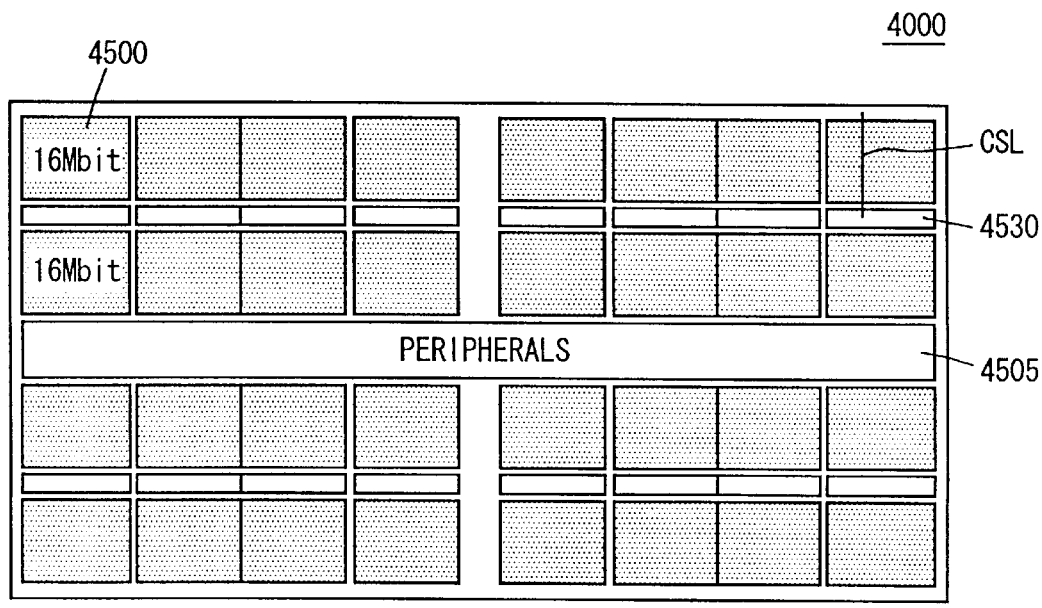
FIG. 16 shows an overall structure of a semiconductor memory device 4000 according to a conventional art.
Figure 17:
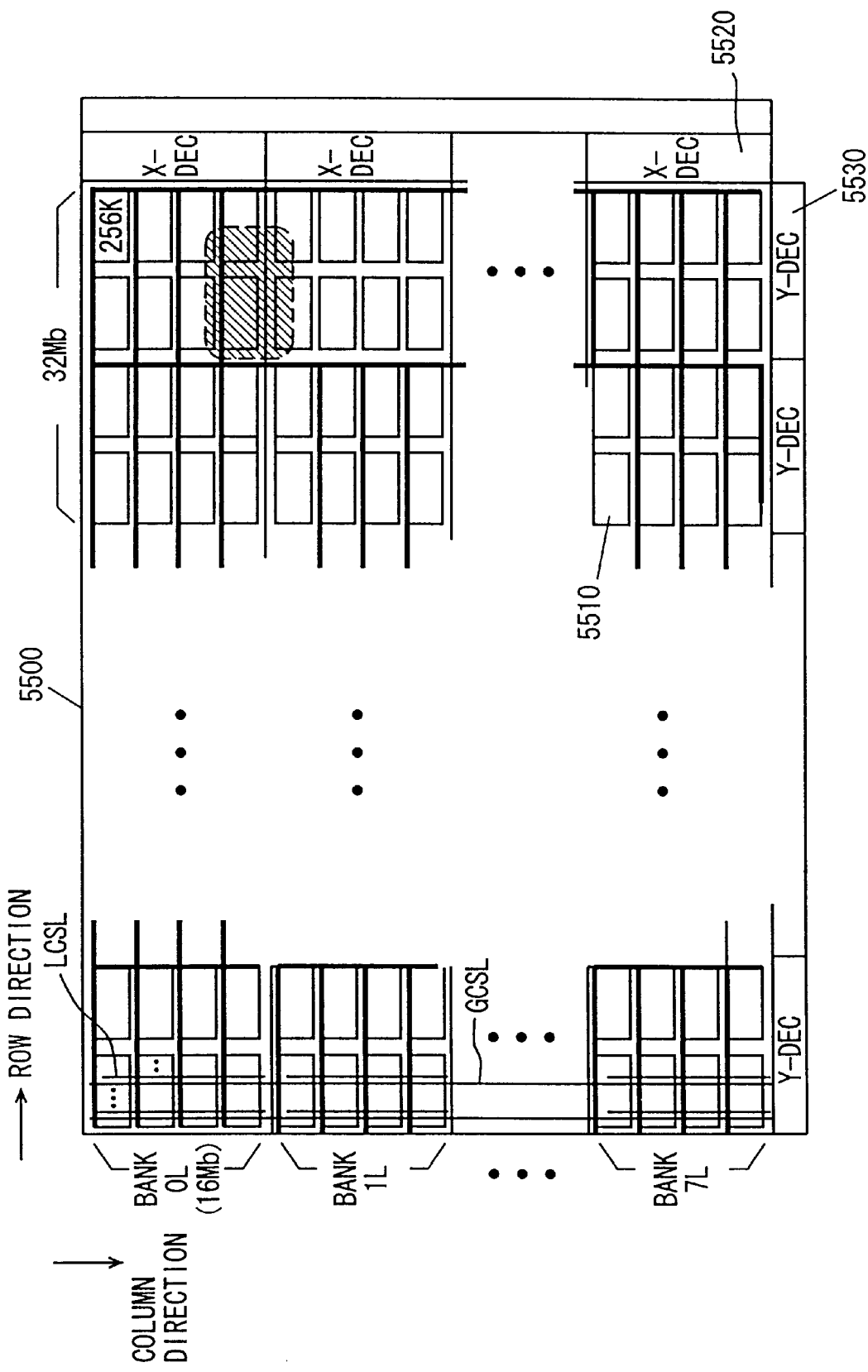
FIG. 17 shows a structure of a memory cell array 5500 of a multi-bank DRAM 5000 according to a conventional art.

FIG. 12 is a circuit diagram showing a structure of the sub column decoder 550 raising the "H" level potential of sub column select line SCSL.

With reference to FIG. 12, sub column decoder 550 includes an N-type transistor 108 having a gate connected to a power supply line, and a drain receiving a bank select signal BS, an N-type transistor 109 having a gate receiving bank select signal BS via N-type transistor 108 and connecting main column select line MCSL and sub column select line SCSL, and an N-type transistor 110 having a gate receiving BBS signal which is an inverted signal of bank select signal BS and connecting sub column select line SCSL and the ground line.

At the selection of a memory cell, bank select signal BS is activated to activate a bank including the selected memory cell. Then, N-type transistor 110 turns off and bank select signal BS attaining an active state ("H" level) is applied to the gate of N-type transistor 109 via N-type transistor 108 having the gate connected to the power supply line. Here t0 the gate-to-source parasitic capacitance of N-type transistor 109 is charged by "H" level potential of bank select signal BS. If main column select line MCSL is activated (to an "H" level) thereafter, sub column select line SCSL will be connected to main column select line MCSL and is turned to an active state ("H" level) by N-type transistor 109 turned on according to bank select signal BS. Accordingly, the gate potential of N-type transistor 109 attains the level equal to the sum of the potential of sub column select line SCSL and the potential charged to the gate-to-source parasitic capacitance. Thus, by boosting the gate potential of N-type transistor 109, the drop of the potential corresponding to an "H" level of sub column select line SCSL can be prevented.

With sub column decoder 5550 having the circuit structure shown in FIG. 12, also in the semiconductor memory device with the multi-bank structure adapting hierarchical column selection scheme with 1:1 arrangement of main column select line and sub column select line, a sufficient potential corresponding to an "H" level of data can be stably obtained without increase in power consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a memory mat including a plurality of memory cells arranged in a matrix, said memory mat being divided along a row direction into a first number of sub block groups;
a plurality of main column select lines shared by said first number of sub block groups and each provided for a second number of memory cell columns;
a plurality of sub column select lines provided corresponding to said memory cell columns in said sub block groups; and
a row select circuit and a column select circuit selecting a memory cell in response to an address signal,
said column select circuit including,
a main column decode circuit activating at least one of said main column select lines according to said address signal,
a sub decode circuit selectively activating at least one of sub decode signals corresponding to said memory cell columns respectively, according to said address signal, a plurality of sub decode signal lines provided for each of said sub block groups for transmitting said sub decode signals, and sub column decode circuits each activating a corresponding one of said sub column select lines according to potential levels of one of said sub decode signal lines and one of said main column select lines.

2. The semiconductor memory device according to claim 1, wherein said column select circuit further includes, a burst circuit setting a sub column address determined according to said address signal as an initial value, and sequentially generating a third number of burst column addresses, the third number being at most said second number, and said sub decode circuit activates said sub decode signals according to said burst column addresses, respectively.

3. The semiconductor memory device according to claim 2, wherein said burst circuit starts generation of said burst column addresses according to activation of said at least one of main column select lines, and said main column decode circuit maintains an active state of said at least one of main column select lines until said burst circuit completes generation of said third number of burst column addresses.

4. The semiconductor memory device according to claim 3, wherein said sub column decode circuit includes a logic circuit transmitting, when one of said main column select lines and one of said sub decode signal lines have potential levels corresponding to an active state, a potential level corresponding to said active state to said corresponding one of said sub column select lines.

5. The semiconductor memory device according to claim 3, wherein said sub column decode circuit includes, a first transistor provided to allow an electrical connection of one of said sub decode signal lines and corresponding one of said sub column select lines, a second transistor provided to allow an electrical connection of one of said main column select lines and a gate of said first transistor, having a gate connected to a first power supply line having a potential level corresponding to an active state of said sub column select lines, a third transistor provided to allow an electrical connection of said corresponding one of sub column select lines and a second power supply line having a potential level corresponding to an inactive state of said sub column select lines, having a gate receiving a potential corresponding to an inverted logical level of a signal on said one of said main column select lines.

6. The semiconductor memory device according to claim 2, wherein said memory mat further includes a sub column decoder band with said sub column decode circuit, arranged between said sub block groups adjacent to each other, and said sub decode signal lines extend in the row direction in said sub column decoder band.

7. The semiconductor memory device according to claim 6, wherein said sub decode circuit is provided adjacent to said sub column decoder band for each of said sub block groups.

8. The semiconductor memory device according to claim 6, wherein said burst circuit is provided at least one for each and adjacent to said sub column decoder band.

9. The semiconductor memory device according to claim 2, wherein said burst circuit transmits said burst column addresses for said sub decode circuit corresponding to one of said sub block groups including the selected memory cell.

10. The semiconductor memory device according to claim 1, wherein said sub decode circuit activates said at least one of sub decode signals corresponding to one of said sub block groups including the selected memory cell.

11. A semiconductor memory device comprising:

a memory mat including a plurality of memory cells arranged in a matrix, said memory mat being divided along a row direction into a first number of banks being subjected independently to reading and writing operations, each of said banks being further divided into a plurality of sub blocks along the row direction;

a plurality of main column select lines shared by said first number of banks and each provided for of a second number of memory cell columns;

a plurality of sub column select lines provided corresponding to said memory cell columns in said banks;

a plurality of data lines provided corresponding to said banks, respectively; and a row select circuit and a column select circuit selecting a memory cell in response to an address signal, said column select circuit including, a main column decode circuit activating at least one of said main column select lines according to said address signal, a sub decode circuit selectively activating at least one of sub decode signals corresponding to said memory cell columns respectively, according to said address signal, a plurality of sub decode signal lines independently provided for each of said banks for transmitting said sub decode signals, and a sub column decode circuits each activating a corresponding one of said sub column select lines according to potential levels of one of said sub decode signal lines and one of said main column select lines.

12. The semiconductor memory device according to claim 11, wherein said column select circuit further includes, a burst circuit setting a sub column address determined according to said address signal as an initial value, and sequentially generating a third number of burst column addresses, the third number being no more than said second number, and said sub decode circuit activates said sub decode signals according to said burst column address, respectively.

13. The semiconductor memory device according to claim 12, wherein said burst circuit starts generation of said burst column addresses according to activation of said at least one of main column select lines, and said main column decode circuit maintains an active state of said at least one of main column select lines until said burst circuit completes generation of said third number of burst column addresses.

14. The semiconductor memory device according to claim 13, wherein said sub column decode circuit includes a logic circuit transmitting, when one of said main column select lines and one of said sub decode signal lines have potential levels corresponding to an active state, a potential level corresponding to said active state to said corresponding one of said sub column select lines.

15. The semiconductor memory device according to claim 13, wherein said sub column decode circuit includes, a first transistor provided to allow an electrical connection of one of said sub decode signal lines and corresponding one of said sub column select lines, a second transistor provided to allow an electrical connection of one of said main column select lines and a gate of said first transistor, having a gate connected to a first power supply line having a potential level corresponding to an active state of said sub column select lines, a third transistor provided to allow an electrical connection of said corresponding one of sub column select lines and a second power supply line having a potential level corresponding to an inactive state of said sub column select lines, having a gate receiving a potential corresponding to an inverted logical level of a signal on said one of main column select lines.

16. The semiconductor memory device according to claim 12, wherein said memory mat further includes a sub column decoder band with said sub column decode circuit, arranged between said banks adjacent to each other, and said sub decode signal lines extend in the row direction in said sub column decoder band.

17. The semiconductor memory device according to claim 16, wherein said sub decode circuit is provided adjacent to said sub column decoder band for each of said banks.

18. The semiconductor memory device according to claim 16, wherein said burst circuit is provided at least one for each and adjacent to said sub column decoder band.

19. The semiconductor memory device according to claim 12, wherein said burst circuit transmits said burst column addresses for said sub decode circuit corresponding to one of said banks including the selected memory cell.

20. A semiconductor memory device comprising:

a memory mat including a plurality of memory cells arranged in a matrix, said memory mat being divided along a row direction into a first number of banks being subjected independently to reading and writing operations, each of said banks being further divided into a plurality of sub blocks along the row direction;

a plurality of main column select lines shared by said first number of banks and provided corresponding to respective memory cell columns;

a plurality of sub column select lines provided for said memory cell columns in each of said banks;

a plurality of bank select signal lines each arranged for each of banks; and a row select circuit and a column select circuit selecting a memory cell in response to an address signal, said row select circuit activating one of the bank select signal lines corresponding to one of said banks including said selected memory cell, said column select circuit including, a main column decode circuit activating at least one of said main column select lines according to said address signal, and a plurality of sub column decode circuits provided for said sub column select lines respectively, for selectively activating said sub column select lines according to potential levels of corresponding bank select signal lines and corresponding main column select lines, each of said sub decode circuits including, a) a first transistor provided to allow an electrical connection of corresponding one of main column select lines and corresponding one of said sub column select lines, b) a second transistor provided to allow an electrical connection of corresponding one of bank select signal lines and a gate of said first transistor, having a gate connected to a first power supply line having a potential level corresponding to an active state of said sub column select lines, c) a third transistor provided to allow an electrical connection of said corresponding one of sub column select lines and a second power supply line having a potential level corresponding to an inactive state of said sub column select lines, having a gate receiving a potential corresponding to an inverted logical level of a signal on said corresponding one of bank select signal lines.

* * * * *

UNITED STATES PATENT AND TRADEMARK OFFICE
CERTIFICATE OF CORRECTION

PATENT NO. : 6,160,751
DATED : December 12, 2000
INVENTOR(S) : Shigeki Tomishima Page 1 of 1

It is certified that error appears in the above-identified patent and that said Letters Patent is hereby corrected as shown below:

Claim 11,
Line 9, delete "of" (second occurrence);
Line 27, delete "a" (first occurrence);

Claim 20,
Line 19, change "said selected" to -- the selected --;
Line 29, after "sub", insert -- column --.

Signed and Sealed this

Nineteenth Day of March, 2002

Attest:

Attesting Officer

JAMES E. ROGAN
Director of the United States Patent and Trademark Office